United States Patent [19]

Yanagida et al.

[11] 4,047,971

[45] Sept. 13, 1977

[54] METHOD FOR TREATING A GLASS SURFACE

[75] Inventors: Hiroaki Yanagida, Kashiwa; Tsuneo Ohashi, Katsuta, both of Japan

[73] Assignee: Fujitok Co., Ltd., Tokyo, Japan

[21] Appl. No.: 674,879

[22] Filed: Apr. 8, 1976

[30] Foreign Application Priority Data

May 2, 1975 Japan .................................. 50-53528

[51] Int. Cl.[2] ........................ B08B 3/00; C03C 17/22; C03C 21/00

[52] U.S. Cl. ........................................ 134/2; 65/30 R; 65/30 E; 65/111; 134/3; 134/28; 134/29; 252/DIG. 10

[58] Field of Search ...................... 134/2, 3, 26, 28, 29; 65/30 R, 30 E, 31, 111, 116; 252/DIG. 10

[56] References Cited

U.S. PATENT DOCUMENTS

| | | | |
|---|---|---|---|
| 2,263,489 | 11/1941 | Day | 65/116 |
| 3,232,788 | 2/1966 | Marzocchi et al. | 65/30 R |
| 3,421,915 | 1/1969 | Letter | 65/30 R |
| 3,438,760 | 4/1969 | Loukes et al. | 65/30 E |
| 3,463,626 | 8/1969 | Blanc | 65/30 R X |
| 3,505,049 | 4/1970 | Plumat | 65/30 E |
| 3,679,609 | 7/1972 | Castner | 252/DIG. 10 |
| 3,898,351 | 8/1975 | Kennison et al. | 252/DIG. 10 |

*Primary Examiner*—Robert L. Lindsay, Jr.
*Assistant Examiner*—Marc L. Caroff
*Attorney, Agent, or Firm*—Philip M. Hinderstein

[57] ABSTRACT

A surface treating process for alkali glass to prevent "whitening" thereof. The method comprises bringing the surface of glass into contact with an aqueous solution containing one or more metal nitrates, the nitrate being of a metal selected from the group consisting of iron, nickel, chromium and cobalt.

6 Claims, 3 Drawing Figures

TRICHLOROETHYLENE (DIP)
$HNO_3$ (DIP)
CLEAN WITH WATER
CLEAN WITH NEUTRAL DETERGENT
CLEAN WITH WATER
$HNO_3$ (DIP)
$Ni(NO_3)_2$ 0.3 %
$Fe(NO_3)_2$ 0.3 % } AQUEOUS SOLUTION (DIP)
(C) (B) (A) $NH_4OH$ AQUEOUS SOLUTION (DIP)
CLEAN WITH WATER
TREAT WITH ISO-PROPYL ALCOHOL AND DRY

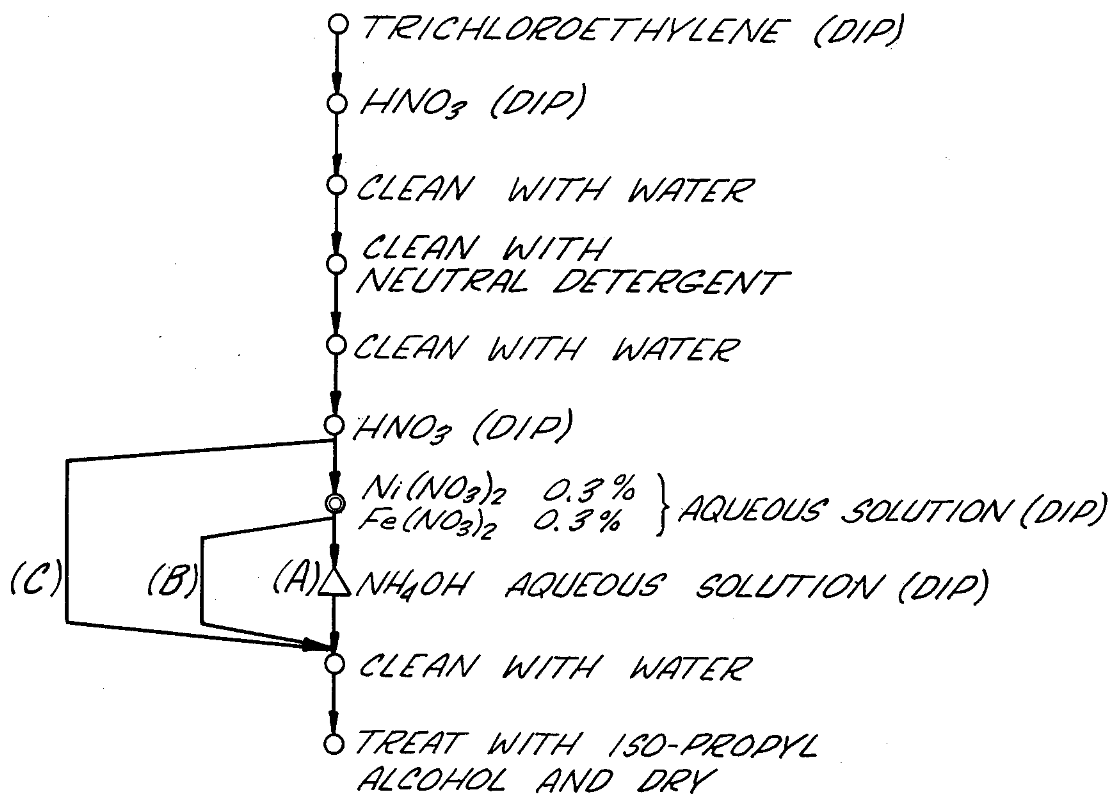
FIG. 1.
TRICHLOROETHYLENE (DIP)
$HNO_3$ (DIP)
CLEAN WITH WATER
CLEAN WITH NEUTRAL DETERGENT
CLEAN WITH WATER
$HNO_3$ (DIP)
$Ni(NO_3)_2$ 0.3 %
$Fe(NO_3)_2$ 0.3 %
AQUEOUS SOLUTION (DIP)
(C)
(B)
(A)
$NH_4OH$ AQUEOUS SOLUTION (DIP)
CLEAN WITH WATER
TREAT WITH ISO-PROPYL ALCOHOL AND DRY

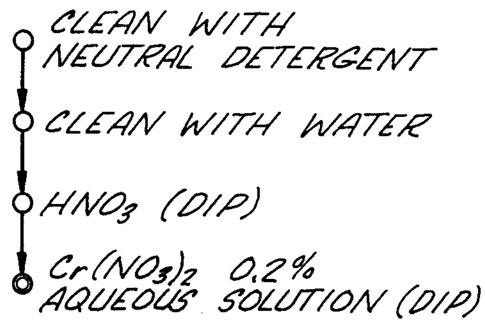
CLEAN WITH NEUTRAL DETERGENT
CLEAN WITH WATER
FIG. 2.
$HNO_3$ (DIP)
$Cr(NO_3)_2$ 0.2%
AQUEOUS SOLUTION (DIP)

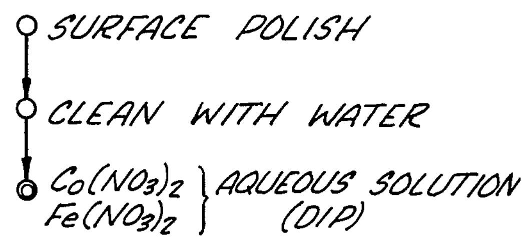
FIG. 3.
SURFACE POLISH
CLEAN WITH WATER
$Co(NO_3)_2$
$Fe(NO_3)_2$
AQUEOUS SOLUTION (DIP)

METHOD FOR TREATING A GLASS SURFACE

BACKGROUND OF THE INVENTION

1. Field of the Invention

The present invention relates to a method for chemically treating a glass surface to prevent "whitening" thereof and, more particularly, to a glass plate used for an integrated circuit in electronics, optical apparatus or building structures.

2. Description of the Prior Art

It is known that glass surfaces and, more particularly, the surface of glass whose material contains sodium, potassium or other alkali metals, i.e., alkali glass, becomes white or smoked when exposed to moist air after manufacturing of the glass. This phenomenon is hereinafter referred to as "whitening." When such a glass plate is used for an integrated circuit, it is necessary that the surface be extremely smooth and free of impurities and imperfections. Whitening shows that the surface of the glass is not extremely smooth and reduces the yield of the product in the processing that follows. Accordingly, the phenomenon must be severely inhibited. Furthermore, the prevention of whitening is widely desired in the field of glass incorporated within precision optical instrument or apparatus as well as with a building construction material because the change in color is objectionable.

It has been considered that the whitening that evloves on a glass surface is due to moisture in the atmosphere. To inhibit whitening, treatment with various chemicals and treatment with heat have been attempted. For example, organic materials or moisture on a glass surface may be removed with a neutral detergent or with isopropanol or freon, respectively. While these methods temporarily remove impurities and moisture existing on a glass surface, they cannot be removed permanently. Furthermore, the surface of the glass absorbs moisture again in the air to generate the whitening phenomenon as a result of a slight deviation of temperature. Glass treated in accordance with the above methods has only a limited utility since it causes a peeling phenomenon of a coating thereon, a chemical change on its surface and the like.

SUMMARY OF THE INVENTION

According to the present invention, these problems are solved by providing a method for treating a glass surface which virtually eliminates the phenomenon of whitening. The method of the present invention comprises bringing the surface of a glass into contact with a solution containing one or more metal nitrates which are selected from the group consisting of iron, nickel, chrominum and cobalt. The invention also comprises bringing the glass surface treated as above into contact with an aqueous solution of ammonia in succession.

OBJECTS

It is an object of the present invention to provide a very economical method to prevent a glass surface from whitening.

It is a further object of the present invention to provide a very simple and effective method to prevent a glass surface from whitening.

It is a further object of the present invention to provide a method to produce a glass plate suitable for an integrated circuit.

It is further object of the present invention to provide a method to produce a glass plate suitable for an optical apparatus.

It is a further object of the present invention to provide a method to produce a glass plate suitable for a building material.

It is a further object of the present invention to improve adherence of metal films on a glass surface.

It is another object of the present invention to improve the yield of a product in the process of integrated circuit production.

Still other objects, features and attendant advantages of the present invention will become apparent to those skilled in the art from a reading of the following detailed description of the preferred embodiments constructed in accordance therewith.

BRIEF DESCRIPTION OF THE DRAWINGS

FIG. 1 is a process diagram according to a first embodiment of the present invention;

FIG. 2 is a process diagram according to a second embodiment of the present invention; and FIG. 3 is a process diagram according to a third embodiment of the present invention.

DESCRIPTION OF THE PREFERRED EMBODIMENTS

Referring now to the drawings and, more particularly, to FIG. 1 thereof, there is shown the present method according to a first embodiment of the present invention. A plate of transparent soda glass (50 mm × 50 mm, 1.5 mm thickness) was used as a test piece.

In a series of the surface treating processes as shown in FIG. 1, the process marked with a double circle (◎) and the process marked with a triangle (Δ) are both novel and characteristic processes according to the present invention. The total process in FIG. 1 is referred to as Process (A). The process in which only the process marked with a triangle (Δ) is excluded from Process (A) is referred to as Process (B). A process in which the processes marked with a double circle (◎) and a triangle (Δ) are excluded from Process (A) is referred to as Process (C). Each of 30 pieces of the above sample was treated according to processes (A), (B), and (C), respectively, the common procedures in these processes being conducted under the same conditions.

According to Process (A), a piece of glass is dipped in trichloroethylene, dipped in nitric acid, cleaned with water, cleaned with neutral detergent, cleaned with water, dipped in nitric acid, dipped in an aqueous solution of 0.3% nickel nitrate and 0.3% iron nitrate, dipped in an aqueous solution of ammonia, cleaned with water and treated with iso-propyl alcohol and dried. According to Process (B), the step of dipping in aqueous ammonia is omitted. According to Process (C), both the steps of dipping in nickel nitrate and iron nitrate and dipping in an aqueous solution of ammonia are omitted.

Immediately after these treatments, the "whitening" phenomenon was not detected on all test pieces treated according to Processes (A), (B), and (C). After the treatment by each process defined above, the test pieces were allowed to stand for 24 hours at a temperature of 4°-10° C. and saturated humidity in a closed vessel, on the interior walls of which appeared drops of water. Subsequently, the test pieces were taken out into an atmosphere of 18° C. and 60% relative humidity and the samples examined.

The results were as follows:

Process (A): The 30 test pieces showed to whitening on their surface.

Process (B): The 30 test pieces showed no whitening on their surface.

Process (C): The whitening phenomenon was detected on all of the 30 test pieces.

That is, the methods or processes of the present invention have a marked inhibition for the evolution of whitening.

Still further, the test pieces discribed above were subjected to various accelerating tests. It was found that the test pieces treated by Process (A) showed a slighty superior effect to those of the others with respect to the inhibiting of whitening.

FIG. 2 is a process diagram according to the second embodiment of the present invention. According to the embodiment of FIG. 2, chromium nitrate was used as the treating reagent. Test pieces of soda glass were cleaned with a neutral detergent, cleaned with water, dipped in nitric acid and dipped in an aqueous solution of 0.2% chrominum nitrate. In this case, the strict tests and examinations as described with regard to the process of FIG. 1 were not carried out. Chromium nitrate showed, however, from the manufacturing experience obtained by this time, an extraordinary inhibition effect against whitening.

FIG. 3 is a process diagram according to the third embodiment of the present invention. According to this embodiment, a test piece of soda glass was subjected to a surface polishing process, followed by cleaning with water without washing with a solution of neutral detergent, and then dipped in an aqueous solution of cobalt nitrate and iron nitrate. In this example, strict tests or examinations were not carried out. However, a remarkable inhibition against whitening was observed.

With respect to the concentration of metal nitrate, the optimum valve is not critical since it depends on the degree of washing which follows. When a large amount of metal ion remains and adheres on the surface of a product such as, in particular, a glass plate used for manufacturing integrated circuit, etc., some inconveniences other than those described above arise. Accordingly, a nitrate solution of a relatively low concentration is used for this purpose. On the other hand, the ion remaining on the surface of a glass such as a glass plate used for a building, is preferable because of its permanent inhibition against whitening. In such a case, there is substantially no limitation in the concentration of metal ion, so far as the inhibition for whitening is concerned.

The reason why whitening can be inhibited by the methods of the present invention is inferred, though not clarified, as follows. When a sodium ion is attached to a micropore (smaller than one miron) it takes out successively internal sodium ions and moisture acts thereon to cause the "whitening" phenomenon. On the other hand, a metal nitrate such as a nitrate of iron, cobalt, chromium or nickel, etc, is prone to deposit on the pore in a form of hydroxide to prevent sodium ions from being taken out successively from the inner parts. As a result of the above phenomenon, the whitening cannot be caused even in the presence of moisture or water.

As described above,, the surface treating methods of the present invention which can be applied to an alkali glass is conducted industrially and very economically and shows a marked inhibition effect for whitening. In the foregoing examples, in dipping method in which a glass was dipped into a solution was disclosed in detail. Other methods such as spraying method whereby a solution is brougt into contact with the glass surface may also be conducted, taking the shape and bulkiness of a product to be treated and the manufacturing process into consideration.

The method of the present invention may be applied in practice to an alkali glass other than soda glass in the same manner as above.

We claim:

1. A method for treating a solid alkali glass surface to prevent whitening thereof comprising the steps of:

pre-cleaning said glass surface;

bringing said pre-cleaned glass surface into contact with an aqueous solution containing one or more metal nitrates selected from the group consisting of nitrates of iron, nickel, chromium and cobalt in amounts effective to prevent whitening of said glass surface; and immediately thereafter post-cleaning said metal nitrate treated glass surface.

2. A method for treating a glass surface according to claim 1 further comprising bringing the surface treated with an aqueous solution containing one or more metal nitrates into contact with an aqueous solution of ammonia.

3. A method for treating a glass surface according to claim 2 wherein the step of bringing the surface of a glass into contact with an aqueous solution containing one or more metal nitrates is preceded by the step of bringing the surface of the glass into contact with nitric acid.

4. A method for treating a glass surface according to claim 3 wherein the step of bringing the surface of a glass into contact with nitric acid is preceded by the step of cleaning the glass surface with water.

5. A method for treating a glass surface according to claim 4 wherein the step of cleaning the glass surface with water is preceded by the step of cleaning the glass surface with a neutral detergent.

6. A method for treating a glass surface according to claim 2 wherein said post-cleaning step comprises:

cleaning said glass surface with water.

* * * * *